United States Patent
Hsu et al.

(10) Patent No.: US 9,386,721 B2
(45) Date of Patent: Jul. 5, 2016

(54) FIXING DEVICE FOR SLIDING MECHANISM

(71) Applicant: JOCHU TECHNOLOGY CO., LTD., Hsinchu County (TW)

(72) Inventors: Kuo-Ming Hsu, Tainan (TW); Tzu-Chien Huang, Taipei (TW); Hsin-Han Lee, Hsinchu (TW); You-Lun Wu, Taoyuan (TW)

(73) Assignee: JOCHU TECHNOLOGY CO., LTD., Hsinchu County (TW)

( * ) Notice: Subject to any disclaimer, the term of this patent is extended or adjusted under 35 U.S.C. 154(b) by 99 days.

(21) Appl. No.: 14/296,954

(22) Filed: Jun. 5, 2014

(65) Prior Publication Data

US 2015/0359130 A1 Dec. 10, 2015

(51) Int. Cl.
*H05K 7/14* (2006.01)
*A47B 88/04* (2006.01)

(52) U.S. Cl.
CPC .......... *H05K 7/1489* (2013.01); *A47B 88/0418* (2013.01); *A47B 2088/0444* (2013.01)

(58) Field of Classification Search
CPC .... F16C 29/005; F16C 29/046; F16C 29/048; A47B 88/10; A47B 88/04; A47B 2088/04444; A47B 2210/0032; A47B 2210/0064; A47B 2210/0067; A47B 2210/007; A47B 2210/0081; H05K 7/1489
See application file for complete search history.

(56) References Cited

U.S. PATENT DOCUMENTS

| | | | | | |
|---|---|---|---|---|---|
| 4,560,212 | A * | 12/1985 | Papp | ...................... | A47B 88/10 312/334.47 |
| 5,551,775 | A * | 9/1996 | Parvin | .................... | A47B 88/10 312/334.11 |
| 6,350,001 | B1 * | 2/2002 | Chu | ........................ | A47B 88/10 312/334.11 |
| 6,749,276 | B2 * | 6/2004 | Judge | ..................... | A47B 88/10 312/334.11 |
| 6,962,397 | B2 * | 11/2005 | Dobler | ............... | A47B 88/0407 312/333 |
| 7,210,752 | B2 * | 5/2007 | Dubon | .................. | A47B 88/08 312/333 |
| 7,780,252 | B2 * | 8/2010 | Mushan | ................. | A47B 88/10 312/333 |
| 8,132,875 | B2 * | 3/2012 | Juang | ..................... | A47B 88/08 312/333 |
| 8,317,278 | B2 * | 11/2012 | Enos | ...................... | A47B 88/10 312/332.1 |
| 2008/0018214 | A1 * | 1/2008 | Huang | ................... | A47B 88/08 312/334.46 |
| 2010/0259146 | A1 | 10/2010 | Chen et al. | | |
| 2011/0262060 | A1 * | 10/2011 | Yu | .......................... | A47B 88/08 384/21 |
| 2013/0016928 | A1 | 1/2013 | Chen et al. | | |
| 2014/0072248 | A1 | 3/2014 | Chen et al. | | |

* cited by examiner

*Primary Examiner* — Alan B Waits
(74) *Attorney, Agent, or Firm* — Rabin & Berdo, P.C.

(57) ABSTRACT

A positioning device for a sliding mechanism includes slidably connected exterior plate, intermediate plate and interior plate, characterized by the exterior plate having a stop block; the intermediate plate formed with a through hole, including having a pivot element mounted pivotally adjacent to the through hole and having a projection extending through the hole to engage the stop block, thereby preventing sliding action between the exterior and intermediate plates, a resilient element having a free end in contact with the rear end of the pivot element; and the interior plate having a push element with cam face; when an external force applied on so as to cause sliding action between the interior plate and the intermediate plate results in abutment of the cam face against the resilient element, thereby deforming the resilient element and rotating the pivot element about its axis, thereby disengaging the projection from the stop block.

5 Claims, 5 Drawing Sheets

FIXING DEVICE FOR SLIDING MECHANISM

BACKGROUND OF THE INVENTION

1. Field of the Invention

The present invention relates generally to a fixing device, and more particularly to a fixing device for a sliding mechanism consisting of slidably connected exterior, intermediate and interior plates, wherein once the interior plate is pulled outward from the intermediate plate, no damage is caused to any one of the plates regardless of weight amount of external force applied to the plates.

2. The Prior Arts

In a personal computer (PC), a server is mounted slidably to a computer casing via two slide plates, which cooperatively define a slide channel therebetween. In case of repairing, the server can be pulled outward from the casing and after the repairing the server is pushed slidably back into the casing. A conventional sliding mechanism used in a PC generally includes an exterior plate, an interior plate and sometimes an intermediate plate between the exterior and interior plates in order to increase a total traveling length of the sliding mechanism. The exterior plates are fixed securely to two opposite sides of the computer casing while the interior plates are used for carrying the server thereon.

For a conventional sliding mechanism consisting of an exterior plate, an intermediate plate and an interior plate connected slidably relative to one another, a fixing device is provided between the intermediate plate and the exterior plate in order to provide stability to the server, which is disposed outwardly of the computer casing after successively pulling the interior plate from the intermediate plate, the intermediate plate from the exterior plate, such that the intermediate plate is exposed and thus retained at the stable condition with respect to the exterior plate. It is noted that in case of a great impact applied on the conventional sliding mechanism at this time, ruin of the sliding mechanism will be resulted since the plates cannot withstand the great impact.

Taiwanese Patent Publication No. 201228568 discloses a sliding mechanism consisting of an exterior plate, an intermediate plate slidably mounted to the exterior plate, an interior plate slidably mounted to the intermediate plate, a locking element pivotally mounted on the intermediate plate and a resilient element in contact with the locking element. The exterior plate is provided with a support unit and a securing element installed at the front end of the support unit. The securing element defines a limiting groove. The intermediate plate is further formed with a stop block. The locking element includes first and second barbed sections such that when the first barbed section engages the support unit of the exterior plate the second barbed section thereof engages the stop block of the intermediate plate so that the interior and intermediate plates can be pulled simultaneously outward relative to the exterior plate. While the interior and intermediate plates move slidably forward in the exterior plate and after sliding over the support unit, the resilient element restores to its initial position so as to release engagement of the second barbed section from the stop block once the first barbed section of the locking element drops into the limiting groove in the securing element, where the interior plate can be pulled outward from the intermediate plate.

It is noted that the above sliding mechanism is relatively complicated in structure owing to too much components and hence results in a large manufacturing expense. Moreover, the stop block and the locking element of the intermediate plate are subjected easily to damage in case of an external impact, which, in turn, leads to ruin of the sliding mechanism.

SUMMARY OF THE INVENTION

A primary objective of the present invention is to provide a slide positioning device for a sliding mechanism that includes an exterior plate, an intermediate plate connected slidably to the exterior plate and an interior plate connected slidably to the intermediate plate. When the intermediate plate is pulled outwardly from the intermediate plate, the former two do not easily damaged or ruined owing to specific structure of the slide positioning device of the present invention.

According to the present invention, the exterior plate is provided with a stop block while the intermediate plate is provided with a pivot element and a resilient element. The pivot element generally extends in a horizontal direction owing to its ground gravity (when no external force is applied thereon), one end of the pivot element is tightly abutted by one side of the stop block so as to prevent the same from rotation about its axis. Under this condition, the intermediate plate cannot be slide into the exterior plate. The interior plate is provided with a push element and inward pushing of the interior plate relative to the intermediate plate results in deformation of the resilient element, which, in turn, permits rotation of the pivot element about its axis, thereby disengaging the pivot element relative to the stop block and permitting inward sliding action of the intermediate plate relative to the exterior plate.

A slide positioning device of the present invention is used in a sliding mechanism including an exterior plate, an intermediate plate connected slidably to the exterior plate and an interior plate connected slidably to the intermediate plate, each plate further defining inner and outer side surfaces. The slide positioning device of the present invention is characterized by: the exterior plate further having a stop block formed on the inner side surface thereof; the intermediate plate further having a through hole formed through the inner and outer side surfaces thereof; including a pivot element that is mounted pivotally on the inner side surface adjacent to the through hole and that has opposite front end rear ends, the rear end being formed with a projection extending through the through hole to engage one side of the stop block of the exterior plate owing to its initial ground gravity (or when no external force is applied on the pivot element), thereby preventing sliding action between the exterior plate and the intermediate plate, the intermediate plate further including a resilient element that is mounted securely on the inner side surface and that has a free end in contact with the front end of the pivot element; and the interior plate having a push element that is fixed on the outer side surface and that is formed with a cam face. When an external force applied on the exterior plate so as to cause sliding action between the interior plate and the intermediate plate results in abutment of the cam face of the push element against the resilient element, thereby deforming the free end of the resilient element, which in turn rotates the pivot element about its axis, thereby disengaging the projection from the stop block to permit slide action between the exterior plate and the intermediate plate.

For simplicity of the structure, the projection is formed by partially bending the rear end of the pivot element.

In this embodiment, the resilient element is generally Z-shaped having one end fixed to the inner side surface of the intermediate plate while the free end contact with the front end of the pivot element.

In one embodiment of the present invention, the cam face of the push element is inclined with respect to a longitudinal length of the interior plate.

Due to above stated structure, a slide action between the push element of the interior plate and the resilient element of the intermediate plate along the longitudinal length results in pivot action of the pivot element, thereby disengaging the projection from the stop block to permit slide action between the exterior plate and the intermediate plate.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
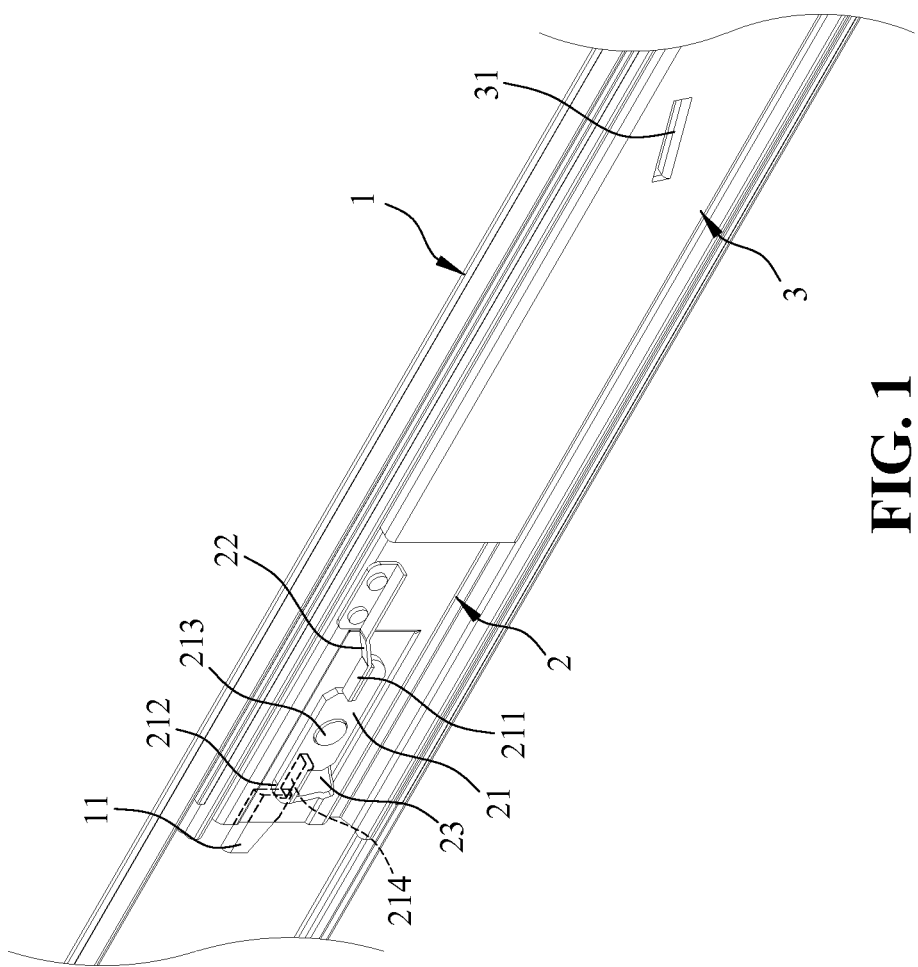
FIG. 1 is a perspective view of a slide positioning device of the present invention for use in a sliding mechanism.
Figure 2:
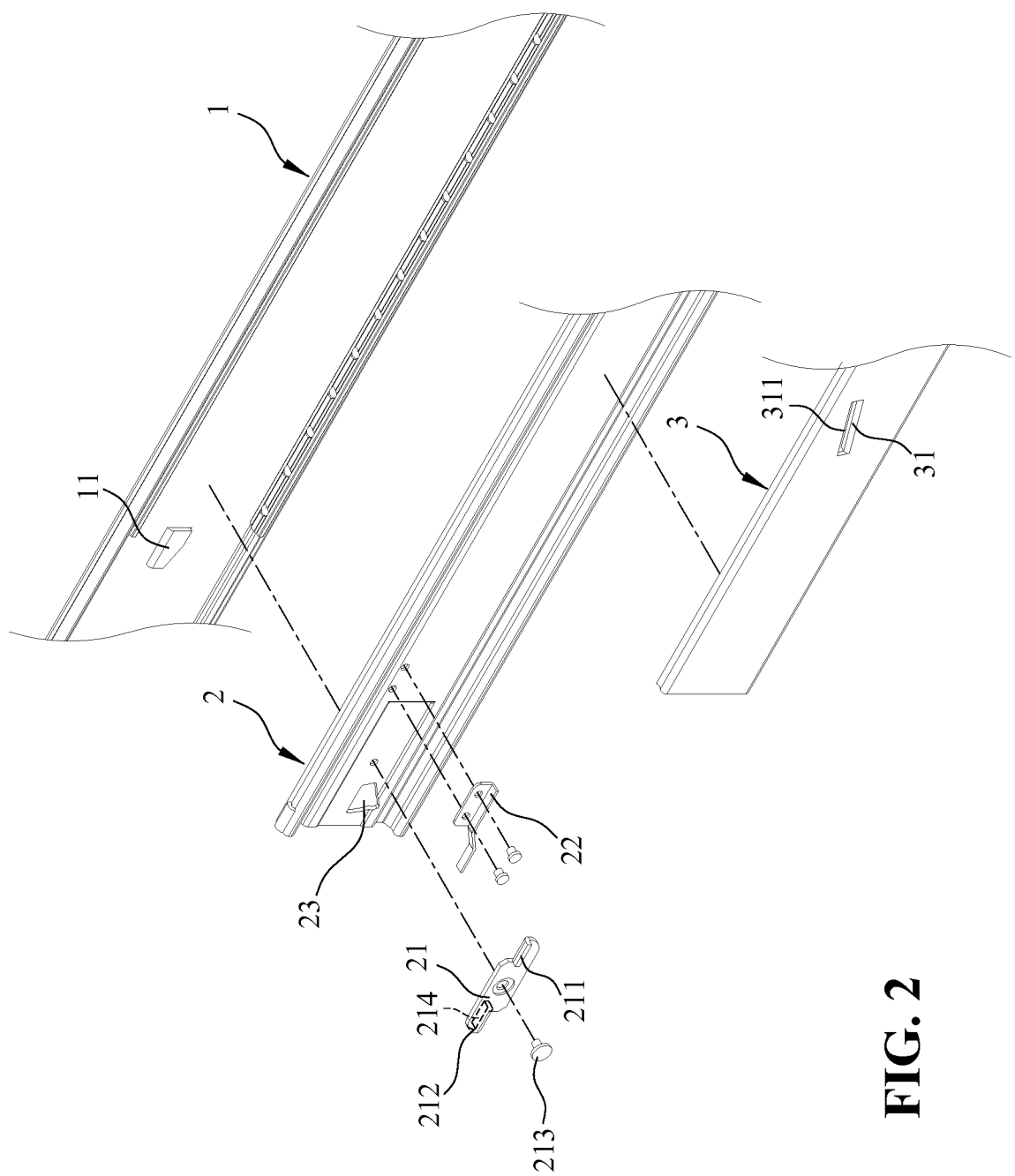
FIG. 2 illustrates the slide positioning device of the present invention for use in the sliding mechanism, which is shown in exploded view.

Referring to FIGS. 1 and 2, wherein FIG. 1 is a perspective view of a slide positioning device of the present invention for use in a sliding mechanism and FIG. 2 illustrates the slide positioning device of the present invention for use in the sliding mechanism, which is shown in exploded view. The slide positioning device of the present invention is used in an electronic device, such as for mounting a server in PC. The sliding mechanism includes an exterior plate 1, which is generally fixed to a side wall of the PC for receiving the server, an intermediate plate 2 connected slidably to the exterior plate 1 and an interior plate 3 connected slidably to the intermediate plate 2 and which generally holds the server thereon such that the server is disposed outwardly of the PC once the interior plate 3 is pulled outward from the intermediate plate 2. Each plate is an elongated plate further has inner side surface defining a slide channel between upper and lower longitudinal peripheries to receive slidably another plate therein and an outer side surface opposite to the inner side surface. The slide positioning device of the present invention is characterized in the following manner.

The exterior plate 1 has a stop block 11 formed on the inner side surface thereof The intermediate plate 2 has a through hole 23 formed through the inner and outer side surfaces thereof, includes a pivot element 21 that is mounted pivotally on the inner side surface adjacent to the through hole 23 via a rivet 213 and that has opposite front end rear ends 211, 212, the rear end 212 being formed with a projection 214 extending through the through hole 23 to engage one side of the stop block 11 of the exterior plate 1 owing to its initial ground gravity (when no external force is applied on the pivot element), thereby preventing sliding action between the exterior plate 1 and the intermediate plate 2.

The intermediate plate 2 further includes a resilient element 22 that is mounted securely on the inner side surface via two rivets and that has a free end in contact with the front end 211 of the pivot element 21. In this embodiment, the free end of the resilient element 22 is in contact with an upper side of the front end 211 of the pivot element 21 such that when an external force is applied thereon so as to deform the resilient 22, the free end of the resilient element 22 will be lifted upward so as to release and permit upward rotation of the front end 211 of the pivot element 21, which, in turn, causes downward rotation of the rear end 212 of the pivot element 21, thereby disengaging the projection 214 from the stop block 11.

The interior plate 3 has a push element 31 that is fixed on the outer side surface and that is formed with a cam face 311.

Figure 3:
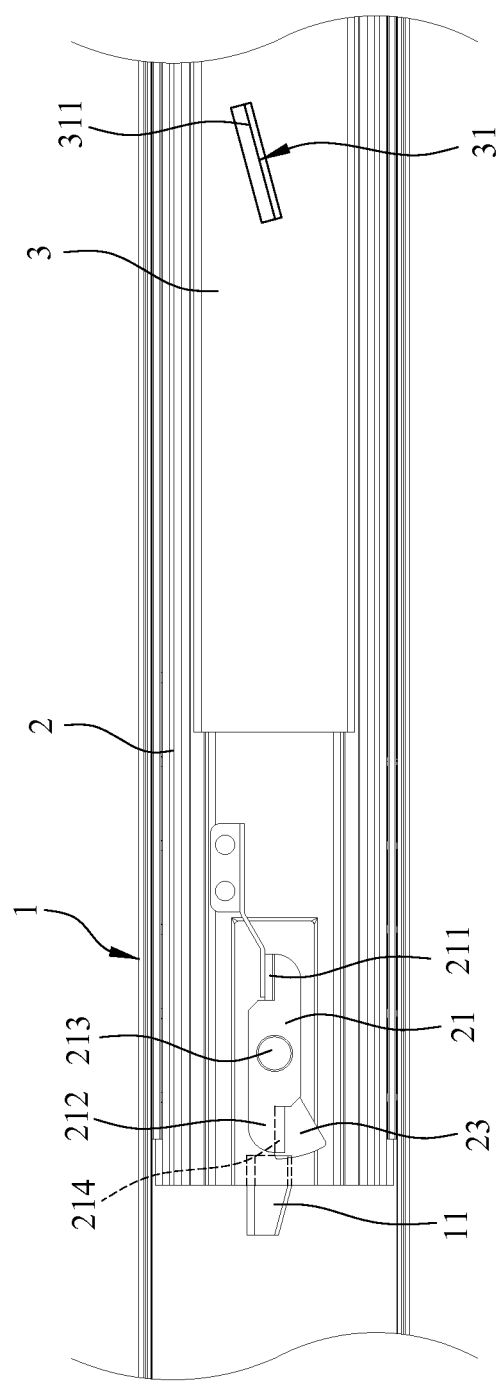
FIG. 3 illustrates the slide positioning device of the present invention for use in the sliding mechanism, which is shown in assembled view.

As shown in FIG. 3, two exterior plates 1 are first of all fixed to two opposite walls of a server reception chamber in a PC. After two interior plates 3 are fixed to two opposite side a server (not visible), the interior plates 3 are mounted slidably into the slide channel in the intermediate plates 2, thereby completing mounting of the server in the PC. In case of replacing or repairing the server (not visible), the interior plates 3 are first of all pulled outward with respect to the intermediate plates 2. Then the intermediate plates 2 are then pulled outward with respect to the interior plates 1. Note that since no external force is applied on the pivot element 21, while the intermediate plates 2 are being pulled outward with respect to the exterior plates 1, the pivot element 21 extends generally along the horizontal direction owing to its ground gravity such the projection 214 abuts against the lower side of the stop block 11 of the exterior plates 1, thereby preventing disengagement of the intermediate plates 2 from the exterior plates 1. In other words, the engagement between the pivot element 21 of the intermediate plate 2 and the stop block 11 of the exterior plate 1 is not affected even a relatively large external force is applied thereon, that is the server is exposed outward of the PC casing in a stable manner.

Figure 4:
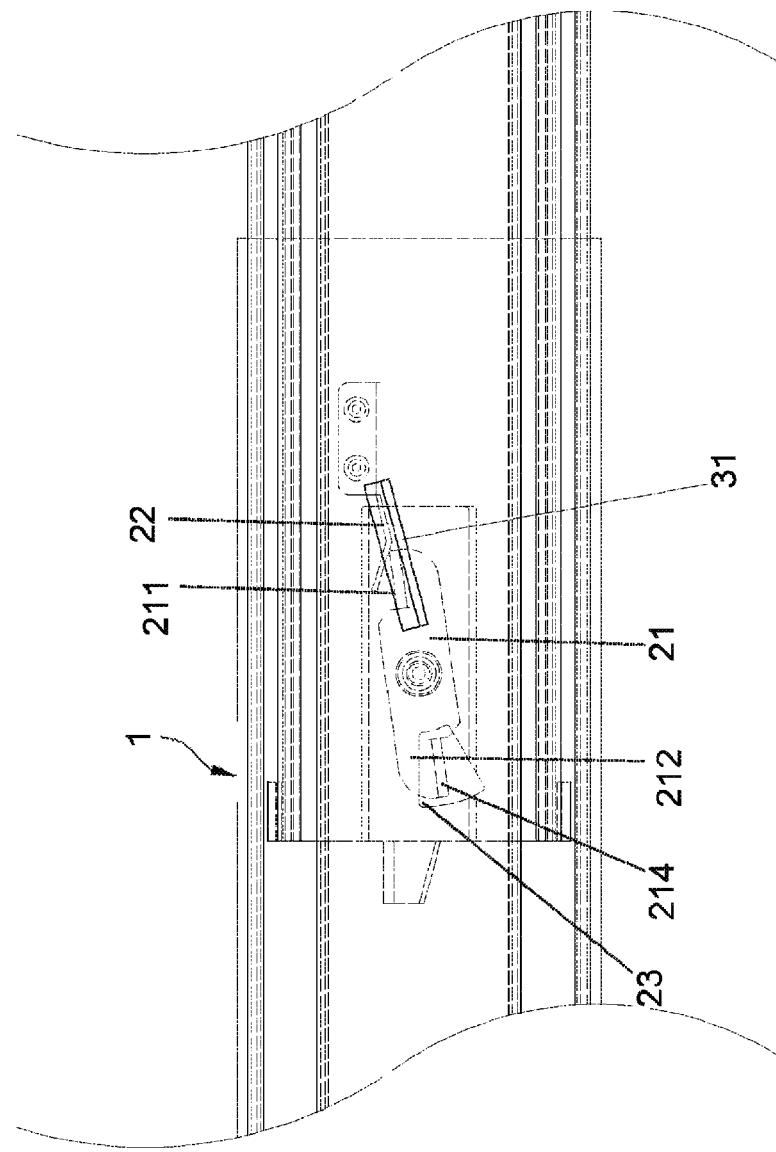
FIG. 4 illustrates the slide positioning device of the present invention for use in the sliding mechanism, where an interior plate is retracted into an intermediate plate.
Figure 5:
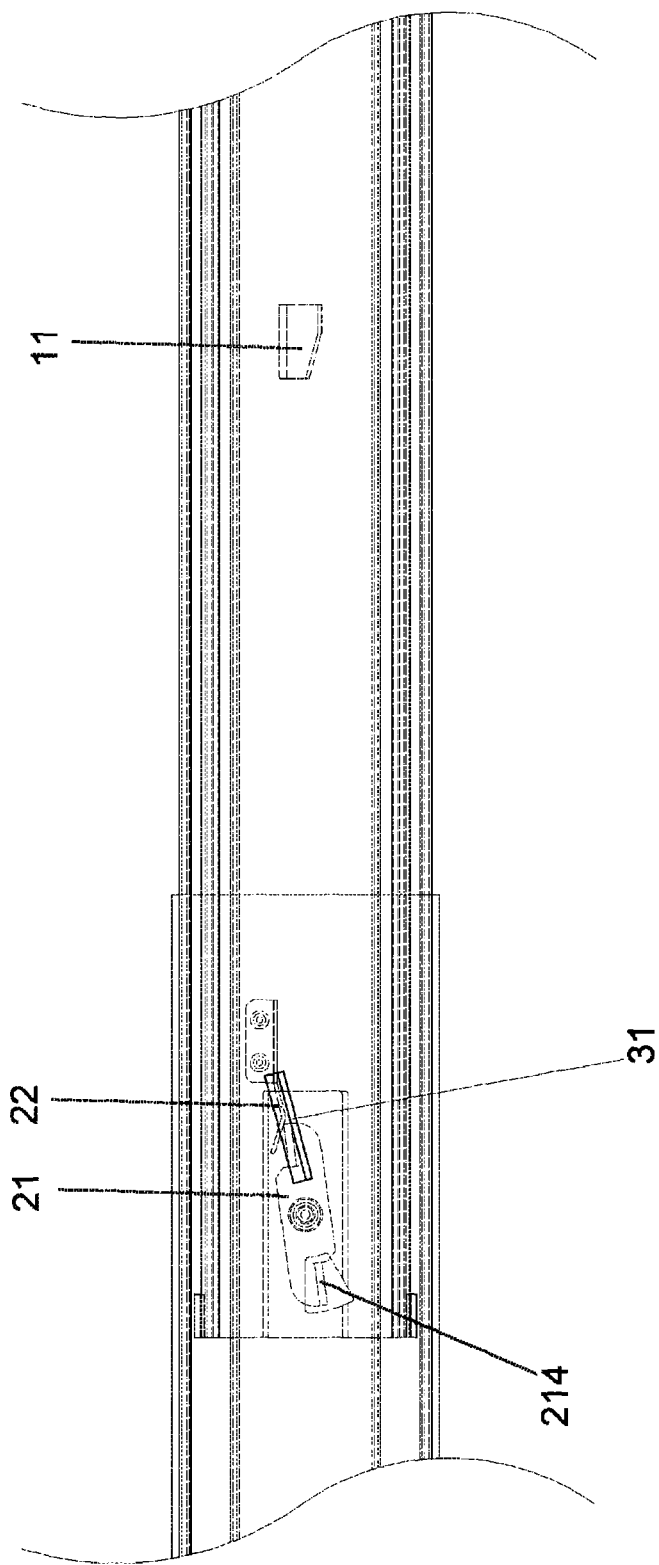
FIG. 5 illustrates the slide positioning device of the present invention for use in the sliding mechanism, where the intermediate plate is retracted into an exterior plate.

As shown in FIGS. 4 and 5, after the repairing of the server, the server is pushed back into the PC manually by the user. In other words, when an external force applied on the interior plates 3 so as to cause sliding action between the interior plate 3 and the intermediate plate 2. To be more specific, slide inward action of the interior plates 3 relative to the intermediate plates 2 results in abutment of the cam face 311 of the push element 31 against the resilient element 22, thereby deforming the free end of the resilient element 22, which in turn rotates the pivot element 21 about its axis, thereby disengaging the projection 214 from the stop block 11 to permit slide action between the exterior plate 1 and the intermediate plate 2.

In this embodiment, the projection 214 is formed by partially bending the rear end of the pivot element 21.

Preferably, the resilient element 22 is generally Z-shaped having one end fixed to the inner side surface of the intermediate plate 2 while the free end contact with the front end 211 of the pivot element 21.

More preferably, the cam face 311 of the push element 31 is inclined with respect to a longitudinal length of the interior plate 3 so that slide action between the push element 31 and the resilient element 22 along the longitudinal length results in pivot action of the pivot element 21, thereby disengaging the projection 214 from the stop block 11 to permit slide action of the intermediate plate 2 within the exterior plate 1.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A slide positioning device for a sliding mechanism that includes an exterior plate, an intermediate plate connected slidably to the exterior plate and an interior plate connected slidably to the intermediate plate, each of the exterior, intermediate and interior plates further having an inner side surface and an outer side surface, the slide positioning device comprising:
   a stop block formed on the inner side surface of the exterior plate;
   a through hole formed through the inner and outer side surfaces, of the intermediate plate;
   a pivot element mounted pivotally on the inner side surface of the intermediate plate adjacent to said through hole and that has opposite front and rear ends, the rear end being formed with a projection extending through said through hole so that in an engaged state, the projection is engaged with one side of said stop block on said exterior plate due to a force of gravity upon the projection so that the front and rear ends in the horizontal direction are balanced, thereby preventing sliding action between the exterior plate and the intermediate plate; and
   a resilient element mounted securely on the inner side surface of the intermediate plate and that has a free end in contact with the front end of said pivot element; and
   a push element that is fixed on the outer side surface of the interior plate and that is formed with a cam face;
   wherein when a force is applied to cause a sliding action between the interior plate and the intermediate plate, the push element pushes the resilient element to enable the resilient element to be rotated to apply a force to the pivot element so that the projection is detached from said stop block to permit slide action between the exterior plate and the intermediate plate.

2. The slide positioning device according to claim 1, wherein said projection is formed by bending the rear end of the pivot element.

3. The slide positioning device according to claim 1, wherein the resilient element is Z-shaped having one end fixed to the inner side surface of the intermediate plate while the free end contacts the front end of the pivot element.

4. The slide positioning device according to claim 3, wherein said cam face of the push element is inclined with respect to a longitudinal length of the interior plate so that a slide action between the push element and the resilient element along the longitudinal length results in a pivot action of the pivot element, thereby disengaging said projection from said stop block to permit slide action between the exterior plate and the intermediate plate.

5. A sliding mechanism comprising:
   an exterior plate having an inner side surface and an outer side surface, the exterior plate further having a stop block formed on the inner side surface thereof;
   an intermediate plate connected slidably to the exterior plate, the intermediate plate having an inner side surface and an outer side surface, the intermediate plate including
      a through hole formed through the inner and outer side surfaces of the intermediate plate,
      a pivot element mounted pivotally on the inner side surface of the intermediate plate adjacent to said through hole and that has opposite front and rear ends, the rear end being formed with a projection extending through said through hole so that in an engaged state, the projection is engaged with one side of said stop block of said exterior plate due to a force of gravity upon the projection, thereby preventing sliding action between the exterior plate and the intermediate plate, and
      a resilient element mounted securely on the inner side surface of the intermediate plate and that has a free end in contact with the front end of said pivot element; and
   an interior plate having an inner side surface and an outer side surface, the interior plate being slidably connected to the intermediate plate, the interior plate having a push element on the outer side surface of the interior plate, the push element being formed with a cam face,
   wherein when a sliding action occurs between the interior plate and the intermediate plate, the push element pushes the resilient element to enable the resilient element to be rotated to apply a force to the pivot element so that the projection is detached from said stop block to permit slide action between the exterior plate and the intermediate plate.

* * * * *